Aug. 3, 1937. E. H. LOFTIN Re. 20,461
METHOD OF AND APPARATUS FOR OPERATING ELECTRICAL AMPLIFIERS
Original Filed Dec. 24, 1925
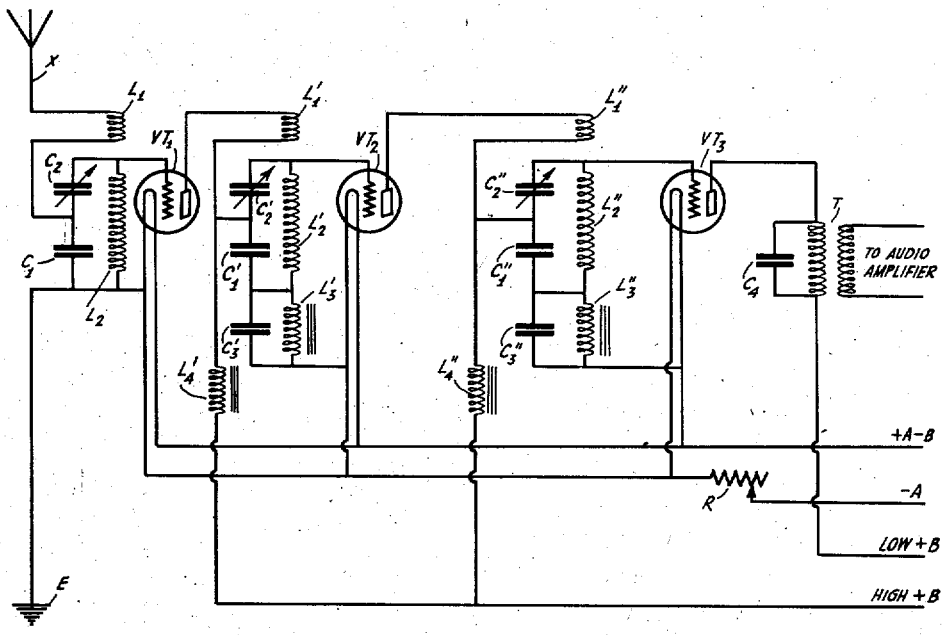
INVENTOR
EDWARD H. LOFTIN
BY H. S. Grover
ATTORNEY Reissued Aug. 3, 1937 Re. 20,461

UNITED STATES PATENT OFFICE 20,461

METHOD OF AND APPARATUS FOR OPERATING ELECTRICAL AMPLIFIERS

Edward H. Loftin, New York, N. Y., assignor, by mesne assignments, to Radio Corporation of America, New York, N. Y., a corporation of Delaware Original No. 1,686,755, dated October 9, 1928, Serial No. 77,445, December 24, 1925. Application for reissue October 6, 1930, Serial No. 486,850

23 Claims. (Cl. 179—171)

My invention relates generally to the operation of electrical amplifiers, and has for one object a manner of and means for operating such amplifiers so that tendency of the amplified energy to react upon the control circuit of the amplifier to add or subtract energy from the control currents is under control.

A particular object of my invention is to control the reaction of the anode circuit upon the control circuit of a three-electrode vacuum tube amplifier, which reaction takes place mainly through the capacity between the electrodes of the tube and the wires leading to these electrodes, principally the so-called plate and grid electrodes and leads thereto.

Another object of my invention is to so control the operation of the amplifier that there is substantially no reaction between the two circuits favorable to producing re-amplification, thereby avoiding any tendency upon the part of the amplifier to become a generator of alternating currents, and to maintain this condition of no reaction while the circuits associated with the amplifier are selectively varied over a wide range of frequencies to cause the amplifier to selectively amplify chosen frequencies.

A further object of my invention is to make the reactance of the circuit in which the currents are amplified low, thereby making it efficient and favorable to efficient transfer to succeeding amplifiers in a multi-stage amplifier system.

A still further object is to provide a system in which the energy transfer from one stage to another remains substantially uniform throughout a wide range of frequencies while maintaining the reaction of the circuit in which the currents are amplified substantially constant.

An additional object is to provide an arrangement whereby capacity elements in the circuits do not prevent energizing the electrodes of the amplifiers from direct current sources of potential.

Another additional object is to provide a system in which the provision for preventing reaction of the circuit in which amplification takes place from reacting on the control circuit is independent of the dimensions and spacings of the electrodes of the amplifier and leads thereto, thereby permitting interchange of amplifiers in the system having different inherent capacities without upsetting the adjustment of the system to prevent troublesome re-amplification or oscillation production.

I find that the difficulty which the art has encountered in trying to employ multiple stage amplification arises mainly from employing an inductive coupling to transfer amplified energy to a succeeding stage, thereby making the reaction of the circuit in which amplification takes place always become inductive some time during the tuning operation, and that an inductive reaction acting through the capacity between the so-called grid and the plate electrodes and leads thereto creates a potential on the grid or control electrode in phase with that produced by the currents in the control circuit, so that with such inductive coupling there is reamplication which frequently is sufficiently strong to produce a generation of oscillations, thereby destroying the system as an amplifying one. Furthermore, the rate of energy transfer to a succeeding stage through the inductive coupling is not uniform with change of frequency. The higher the frequency, the higher the rate of energy transfer for a fixed inductive coupling arrangement, which also means that the inductive reaction in the amplification circuit will be stronger for the higher frequencies than for the lower. Therefore, if the inductive coupling is adjusted to be not sufficiently tight to cause oscillations at the higher frequencies, the rate of transfer becomes quite inefficient at the lower frequencies, thereby making the system as a whole an inefficient amplifier at the lower frequencies.

It is well known that a capacitive reaction in an electrical circuit is 180° out of phase or directly opposed to an inductive reaction, and that if two such reactions are made exactly equal, they neutralize each other, leaving the circuit resistive, but non-reactive. It is this general principle that I employ for controlling the reaction of the circuit in which the currents are amplified, thereby controlling its influence on the control circuit through coupling that might exist between the two, such as the inherent capacity between the electrodes and leads thereto.

The manner in which I accomplish this control over a range of frequencies and other features of my invention will be best understood by reference to the accompanying drawing in which the one figure represents an application in an amplifier system employed for instance in connection with the reception of radio signals. The circuit X represents the usual antenna or collector grounded at E, having in series therewith an inductance element L1 and a capacity element C1. A variable selective circuit comprising inductance L2, variable capacity C2 and capacity C1 is coupled to the antenna through an inductive relation between inductance elements L1 and L2 and capacity element C1, common to the two circuits. In other words, there is a combination inductive and capacitive coupling linking the two circuits, and by making the polarity of element L1 with respect to element L2 of proper phase, the energy transferred through the inductive and capacitive couplings can be made additive or assisting. Now it is obvious that the rate of energy transfer through the capacitive coupling decreases with increase of frequency as condenser C2 is varied, or is the reverse of the effect of inductive coupling in this respect, as previously explained herein. So that the combination provides an arrangement which permits, through proper adjustment, of obtaining a substantially constant rate of energy transfer with variation in frequency, or may equally well be adjusted to produce energy transfer that varies in any desired manner with frequency, and therefore, as previously stated in reference to inductive coupling, this energy transfer determines the reaction of the selective or absorbing circuit back onto the supply circuit.

In other words, there is an absorption reaction whose potential with frequency depends upon the energy transfer or coupling with frequency, and with the combination coupling described the potential of the absorption reaction can be made constant with frequency, or caused to vary therewith in any predetermined manner.

The system is illustrated as containing 3 three-electrode vacuum tube devices, and the two marked VT1 and VT2 are connected so as to act as amplifiers of high frequency alternating currents, and the one marked VT3 is connected so as to act as a detector of such currents.

The high frequency currents selected from the antenna by the selective circuit previously described are passed to vacuum tube VT1 in the usual manner and there amplified in the so-called plate or anode circuit which includes inductance element L'1, capacity element C'1, and capacity element C'3. The capacity elements are shunted by a suitable high frequency choke coil L'4 which permits of energizing the anode of the vacuum tube from a direct current source but to a large degree confines the high frequency currents to the path of the capacity elements just recited.

A selective circuit including inductance element L'2, variable capacity element C'2, and capacity element C'1 links amplifying vacuum tube VT2 with the anode circuit of VT1 through inductive coupling existing between inductance elements L'1 and L'2 and through the common capacity element C'1. As explained before, the combination coupling can be made to transfer energy so that the transfer of the two couplings is additive, and may be made to vary in rate of transfer in any desired manner with change of frequency, and therefore vary with frequency in reaction on the anode circuit.

The capacity element C'3 is not common to the anode circuit and the selective circuit, but may be common to the anode circuit of VT1 and the control circuit of VT2, and therefore take part to a minor degree in the transfer of energy from one to the other. It is shunted by a device having a high impedance to high frequency currents, such as the choke coil L'3, which is conductive to direct currents and therefore provides a path to the control electrode of VT2 for impressing upon its electrode any desired degree of initial or biasing potential.

I have discovered that by properly adjusting in the manner described by S. Y. White in application Serial No. 48,936 of August 8, 1925 the relative couplings produced by inductance element L'1 and capacity element C'1 in the selective circuit coupling, I can produce any desired characteristic of absorption reaction with frequency for combination with a chosen reactance of capacity element C'3, and thereby control the overall reactance of the anode circuit of vacuum tube VT1 to any desired degree such that it may be inductive, may be capacitive, or may be substantially non-reactive though resistive, and thus cause vacuum tube VT1 and its associated circuits to reamplify even to the point of oscillations, or to be neutral and therefore purely an amplifier, or even to deamplify, which last effect is had when capacitive reaction predominates. At times this last effect may be usefully employed, such as when there is so-called "distant stage" coupling, which means that the highly amplified energy in the latter stages of the system acts upon the circuits of the preceding stages to bring about re-amplification or possible oscillations. In such event a little de-amplifying effect through a capacitively reacting anode circuit may overcome the tendency, thereby producing a stable system under circumstances which might have otherwise resulted in an unstable, non-useful amplifying system.

It will therefore be seen that since the result is obtained through the reactive nature of the anode circuit, it makes no difference in stabilizing the system what the capacity between the electrodes of the vacuum tube and the leads thereto may be, thereby differentiating my system in function from existing systems which employ an auxiliary capacity element excited by a reverse energy feed-back system to overcome anode circuit reaction. In these auxiliary circuit systems the auxiliary capacity element must be adjusted for the particular vacuum tube in use, with the result that radio receiving sets adjusted in the factory to a set of vacuum tubes in the hand of the adjuster may be far from neutralized in the hands of the purchaser who has acquired a different set of tubes.

It will also be seen that where I employ an adjustment in which the inductive and capacitive reactions neutralize each other, the anode circuit impedance is a minimum, thereby permitting the maximum flow of current which means maximum efficiency for energy transfer.

The manner in which the system outlined maintains substantial equal and opposing inductive and capacitive reactions in the anode circuit with a wide range of variation of frequency as the succeeding selective circuit is tuned is somewhat involved, depending as it does upon the inductive transfer of energy to the selective circuit, the capacitive transfer of energy to the selective circuit, and the capacitive reaction of the capacity element in the anode circuit and that portion of the control circuit not within the limits of the selective circuit. I have found, however, that with relative adjustments of these elements I can choose the reactive effect of the anode to be of a highly, or any degree, capacitive nature, of a neutral nature, or any degree inductive nature, and maintain any one of these natures substantially constant as the selective circuit is varied through operation of the variable capacity element C'2; or the reaction may be varied in any predetermined manner with frequency.

Detector vacuum tube VT3 is shown connected to amplifying vacuum tube VT2 through the same coupling arrangement I have described. I have found however that it may be necessary to slightly change the values of the coupling elements between an amplifying tube and a detecting tube from those between two amplifying tubes, probably due to the fact that a tube adjusted for detection has a somewhat different degree of internal impedance from one adjusted for amplifying.

I have shown the anode circuit of detecting tube VT3 connected through a transformer T to an audio amplifier not shown but indicated, though a loud speaker or telephone may be inserted directly in the anode circuit if desired. The condenser C4 is the usual by-pass condenser commonly employed in systems such as I have shown, to shunt a low frequency transformer or low frequency responsive translating device.

The leads or wires marked +A and —B represent the usual connections to a battery or other source for heating the filaments of the vacuum tubes, a variable resistance R indicating a means for controlling the amount of heating current. The vacuum tubes VT1 and VT2 are indicated as functioning as amplifiers by having their control electrodes connected to the negative side of the filament leads, and the vacuum tube VT3 is indicated as functioning as a detector by having its control electrode connected to the positive side of the filament circuit. The wires marked —B and high +B indicate the usual connections to a source of potential for energizing the anodes of the vacuum tubes through the connections shown. The wires marked —B and low +B indicate the usual connections to a source of potential for energizing the anode of the detector tube, it being usual to employ a lesser potential for detector tubes than for amplifying tubes.

It will be seen that the choke coils L'4 and L''4 provide conductive paths around the capacity elements C'1 and C'3 for vacuum tube VT1 and around capacity elements C''1 and C''3 for vacuum tube VT2. Also the choke coils L'3 and L''3 provide conductive paths for initially biasing the control electrodes of the vacuum tubes with which these elements are associated.

It is of course understood that the coupling between the anode circuits of preceding tubes and control circuits of succeeding tubes may be made as loose or as tight as desired, both inductively and capacitively, as by selecting different numbers of turns for the inductive elements L1 and different capacity values for the elements C1 and C3. Ordinarily a selective radio receiver requires fairly loose coupling, meaning that the number of turns of L1 is small, and the capacities of C1 and C3 are large with respect to the variable capacities C2. It is obvious that with coupling sufficiently tight to cause sufficient reaction to produce oscillations, the means herein provided for controlling anode circuit reaction will prevent oscillations, or even regenerative amplification.

While I have illustrated and described my invention in its application to a radio receiver, it is of course readily apparent to the art that it has many applications, and I do not wish it to be understood that I intend any limitations in making the choice of a radio receiver merely for descriptive purposes. While I have also described the invention in connection with the use of three-electrode vacuum tube amplifiers, it is of course understood that its features apply to other forms of amplifiers equally well.

Having illustrated and described my invention, I claim:

1. The combination of a three-electrode vacuum tube adapted to amplify alternating currents over a range of frequencies, an output circuit in which said currents are amplified, and means to prevent reamplification in said tube of said amplified currents due to the reaction of said output circuit including capacitive and inductive reactive elements located in said circuit, and a tunable circuit associated with said output circuit through capacitive and inductive elements, said elements being chosen in values with respect to the values of the elements in the output circuit and tunable circuit to maintain the effective capacitive and inductive reactions of said output circuit substantially equal with variation of frequency.

2. The combination of a three-electrode vacuum tube adapted to amplify alternating currents, an output circuit in which said currents are amplified, and means which act, irrespective of the value of the internal capacity of said tube, to prevent reamplification of said amplified currents in said tube including substantially equal reacting capacitive and inductive elements in said output circuit arranged in series to react on said internal capacity through the same path.

3. The combination of a three-electrode vacuum tube adapted to amplify alternating currents over a range of frequencies, an output circuit in which said currents are amplified, a second three-electrode vacuum tube, and means linking said output circuit and second tube including a variably selective circuit having an inductance element and a divided capacity element having one division fixed and one division variable, a capacity element outside of said selective circuit, an inductance element in said output circuit so coupled to the inductance element in said selective circuit as to transfer energy in phase with the energy transferred by said fixed capacity element, said fixed capacity element in said selective circuit and said capacity element outside of said selective circuit also being included in said output circuit.

4. An electrical system including a three-electrode vacuum tube, an output circuit, a tunable circuit associated with said output circuit through an in-phase combination of substantially equally acting inductive and capacitive coupling, and a reactance element in said output circuit in series with said combined coupling.

5. An electrical system including a three-electrode vacuum tube, an output circuit, a tunable circuit coupled to said output circuit through a combined inductive and capacitive coupling adjusted to vary with the tuning of said tunable circuit, and a capacitively reacting element in said output circuit of such value as to balance the inductive reaction of said tunable circuit acting on said output circuit through said coupling of such character and value as to prevent oscillation production in said system.

6. An electrical system including a three-electrode vacuum tube amplifier having an output circuit, a tunable circuit coupled to said output circuit with coupling sufficiently tight that the inductive reaction on said output circuit of said tunable circuit as it is tuned is sufficient to produce oscillations by reason of the regenerative reaction through the interelectrodal capacity of said tube, a condenser in said output circuit in series with said coupling of such capacity value as to produce a reaction that opposes said inductive reaction to such extent as to maintain said regenerative reaction within the non-oscillating region, and a high impedance but conductive path in shunt to said condenser through which the anode of said tube is energized.

7. In a three electrode vacuum tube amplifier system adapted to selectively amplify alternating currents over a range of frequencies including an output circuit to which an adjustable period absorbing circuit is coupled, the method of controlling regenerative reaction through the interelectrodal capacity of the tube produced by the inductive reaction on said output circuit of said adjustable circuit as it is varied over a range of periods which consists of capacitively neutralizing in said output circuit a desired degree of said inductive reaction on said output circuit, and controlling the relative relations between said reactions as said adjustable circuit is varied, whereby a predetermined effect with frequency on the amplifying ability of said tube is obtained.

8. In a three electrode vacuum tube amplifier system adapted to selectively amplify alternating currents over a range of frequencies including an output circuit to which an adjustable period absorbing circuit is coupled, the method of controlling regenerative reaction through the interelectrodal capacity of the tube produced by the inductive reaction on said output circuit of said adjustable circuit as it is varied over a range of periods which consists of capacitively neutralizing in said output circuit a desired degree of said inductive reaction on said output circuit, and controlling the coupling relation between said output circuit and absorbing circuit as said absorbing circuit is varied so that said inductive reaction bears a predetermined relation with frequency to said capacitively neutralizing reaction, whereby the amplifying ability of said tube is governed in a predetermined way with frequency.

9. In a three electrode vacuum tube amplifier system adapted to selectively amplify alternating currents over a range of frequencies including an output circuit to which an adjustable period absorbing circuit is coupled, the method of preventing effective regenerative reaction through the interelectrodal capacity of the tube tending to be produced by the inductive reaction on said output circuit of said adjustable circuit as it is varied over a range of periods which consists of capacitively neutralizing in said output circuit said inductive reaction on said output circuit, and controlling the coupling relation between said output circuit and absorbing circuit as said absorbing circuit is adjusted so that said inductive reaction continuously remains with frequency substantially equal to said capacitively neutralizing reaction, whereby regenerative amplification of said tube with frequency is substantially eliminated.

10. In a three electrode vacuum tube amplifier system adapted to selectively amplify alternating currents over a range of frequencies including an output circuit to which an adjustable period absorbing circuit is coupled through a combined electromagnetic and electrostatic coupling, the method of controlling regenerative reaction through the interelectrodal capacity of the tube produced by the inductive reaction on said output circuit of said adjustable circuit as it is varied over a range of periods, which consists of capacitively neutralizing in said output circuit a desired degree of said inductive reaction on said output circuit, and predetermining the relative values of said electromagnetic and electrostatic couplings so that the combined coupling relation between said output circuit and absorbing circuit as said absorbing circuit is adjusted produces an inductive reaction on said output circuit that bears a predetermined relation with frequency to said capacitively neutralizing reaction, whereby the amplifying ability of said tube with frequency is maintained constant irrespective of degree of regenerative or non-regenerative amplification.

11. In a system for amplifying high frequency electrical currents including a three electrode vacuum tube amplifier having inherent capacity between its electrodes and an output circuit, the method of maintaining in said output circuit uniformly efficient selective amplification of said currents over a wide range of frequencies and efficiently transferring the energy thereof to a succeeding responsive device which comprises selectively impressing the currents to be amplified upon the input electrodes of said amplifier, selectively abstracting amplified current energy from said output circuit through a variable period circuit so tightly coupled thereto that the transient reactions on said output circuit inevitably include that reaction which unmodifiedly acting through said inherent tube capacity is of such phase and potential as to regeneratively produce oscillation, annulling a sufficient amount of the effect of said reaction while maintaining said tight coupling that regeneration is reduced a desired amount below the critical oscillation point, controlling the oscillation producing reaction with frequency to follow any variation with frequency of said annulling effect, and applying the energy abstracted through said maintained tight coupling to said responsive device.

12. In a three electrode vacuum tube amplifier system adapted to selectively amplify alternating currents over a range of frequencies including an output circuit to which an adjustable period absorbing circuit is coupled, means for controlling regenerative reaction through the interelectrodal capacity of the tube produced by the inductive reaction on said output circuit of said adjustable circuit as it is varied over a range of periods which includes a capacitively reacting element of such value and so associated with said output circuit as to neutralize to a desired degree said inductive reaction and means for controlling the relative values of said reactions as said adjustable circuit is varied, whereby a predetermined effect with frequency on the amplifying ability of said tube is obtained.

13. In a three electrode vacuum tube amplifier system adapted to selectively amplify alternating currents over a range of frequencies including an output circuit to which an adjustable period absorbing circuit is coupled, means for substantially preventing re-generative reaction through the interelectrodal capacity of the tube tending to be produced by the inductive reaction on said output circuit of said adjustable circuit as it is varied over a range of periods which includes a capacitively reacting element of such value and so associated with said output circuit as to neutralize said inductive reaction, and means for controlling the coupling relation between said output circuit and absorbing circuit as said absorbing circuit is adjusted so that said inductive reaction continuously remains with frequency substantially equal to the reaction of said capacitively reacting element.

14. In an electrical system including a three-electrode vacuum tube having an output circuit, means for controlling the reactance of said output circuit with frequency including a reactance element therein and an adjustable absorbing circuit coupled thereto, whereby the reaction of said coupled circuit on said output circuit combines with the reaction of said element, and means for causing said coupling to vary in a predetermined manner with the adjustment of said coupled circuit to produce a predetermined reaction with frequency variation for combination with the reaction of said element.

15. In an electrical system including a three electrode vacuum tube having an output circuit, means for controlling the reactance of said output circuit with frequency including a capacitively acting reactance element therein and an adjustable absorbing circuit coupled thereto, whereby the inductive reaction of said coupled circuit on said output circuit neutralizes the reaction of said element, and means for varying one of said reactions with frequency to the same degree as the other of said reactions so varies, and in proper sense, whereby the reactance with frequency of said output circuit is maintained substantially constant.

16. The combination of a three-electrode vacuum tube, an input circuit adapted to be energized with alternating currents to be amplified by said tube, an output circuit, capacitively and inductively reacting elements associated with said output circuit, and means for maintaining the over-all output circuit capacitive reaction to said alternating currents equal to the over-all inductive reaction to the same currents with change of frequency of said currents.

17. In a system for efficiently selectively amplifying high frequency electrical currents over a wide range of frequencies including a three electrode vacuum tube amplifier having inherent capacity between its electrodes, a variable period input circuit, an output circuit, a second vacuum tube, a variable period circuit in the input circuit of said second tube so closely coupled to said output circuit that its reactions on said output circuit as it is varied to follow the varying of the input circuit of said first tube inevitably include that reaction which unmodifiedly acting through said inherent tube capacity is of such phase and potential as to regeneratively produce oscillation, means for annulling a sufficient amount of the effect of said reaction while maintaining said tight coupling that regeneration is reduced a desired amount below the critical oscillation point, and means for controlling said regenerative producing reaction with frequency to follow the effect with frequency of said oscillation prevention means, whereby said prevention is effective to substantially the same degree throughout said wide range of frequencies.

18. In a system for efficiently selectively amplifying high frequency electrical currents over a wide range of frequencies including a three electrode vacuum tube amplifier having inherent capacity between its electrodes, a variable input circuit, an output circuit, a second vacuum tube, a variable period circuit in the input of said second tube coupled to said output circuit through a pair of inphase couplings, one of which couplings has an increasing effect with increase of frequency and the other having a decreasing effect with increase of frequency, the combined effect being to so closely couple said variable circuit to said output circuit that the reactions thereon inevitably include that reaction which unmodifiedly acting through said inherent tube capacity is of such phase and potential as to regeneratively produce oscillation, and means for annulling a sufficient amount of the effect of said reaction while maintaining said close coupling that regeneration is reduced a desired amount below the critical oscillation point, said combined coupling effect and annulling effect being so related as to variation with frequency as to be effective to prevent oscillation to substantially the same degree throughout said wide range of frequencies.

19. In a system for efficiently selectively amplifying high frequency electrical currents as selected over a wide range of frequencies including a three electrode vacuum tube amplifier having inherent capacity between its electrodes, an output circuit, a second vacuum tube, a variable period circuit in the input of said second tube coupled to said output circuit through a pair of inphase couplings, one of which increases in effect with increase of frequency and the other of which decreases in effect with increase of frequency, the combined coupling effect being so tight that the reactions of said variable circuit on said output circuit inevitably include that reaction which unmodifiedly acting through said inherent tube capacity is of such phase and potential as to regeneratively produce oscillation, and means for annulling a sufficient amount of the effect of said reaction while maintaining said close coupling that regeneration is reduced a desired amount below the critical oscillation point, whereby an efficient transfer of a substantially uniform degree of amplification without oscillation over a wide range of frequencies is had.

20. A system of amplification of radiant energy comprising electromagnetic and electrostatic paths of energy transfer and an electronic device wherein the electromagnetic and the electrostatic values of said transfer paths are balanced to produce a zero difference of potential in respect to all undesired currents between the elements of the electronic device and to obtain a substantially equal energy transfer throughout the range of frequencies to which the system is tunable.

21. A system of amplification of radiant energy comprising electromagnetic and electrostatic paths of energy transfer and an electronic device wherein the electromagnetic and the electrostatic values of said transfer paths are balanced to produce a zero difference of potential in respect to all undesired currents between the grid and plate of the electronic device and to obtain a substantially equal energy transfer throughout the range of frequencies to which the system is tunable.

22. In a system of amplification of radiant energy comprising an electronic device, a transformer, a tuning capacity, a capacity connected in series between the primary and secondary of said transformer, said capacity being also in series with the tuning capacity, and both capacities being connected in shunt across the secondary of the transformer, said capacities providing an electro-static coupling and said inductances providing an electromagnetic coupling, the process consisting in automatically varying the energy transfer through the electrostatic coupling as the tuning capacity is varied and to such a degree as to compensate for the natural change of energy transfer in the electromagnetic coupling arising from change of frequency, thereby effecting a condition of energy transfer maintained constant at its maximum value for any desired range of frequency and thereby simultaneously maintaining a condition of complete non-regeneration.

23. In a system of amplification of radiant energy comprising an electronic device, a transformer, a tuning capacity, a capacity connected in series between the primary and secondary of said transformer, said capacity being also in series with the tuning capacity, and both capacities being connected in shunt across the secondary of the transformer, said capacities providing a static coupling and said inductances providing a magnetic coupling, the process consisting in automatically varying the energy transfer through the static coupling as the tuning capacity is varied and to such a degree as to compensate for the natural change of energy transfer in the magnetic coupling arising from a change of frequency but in the inverse ratio thereby simultaneously maintaining a condition of complete non-regeneration and a condition of energy transfer maintained constant at its maximum value at any desired frequency.

EDWARD H. LOFTIN.